(12) United States Patent
Mui et al.

(10) Patent No.: US 11,842,978 B1
(45) Date of Patent: Dec. 12, 2023

(54) WIRE BONDING SYSTEM INCLUDING A WIRE BIASING TOOL

(71) Applicant: ASMPT SINGAPORE PTE. LTD., Singapore (SG)

(72) Inventors: Man Kit Mui, Hong Kong (CN); Kwun Man Ng, Hong Kong (CN)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/865,471

(22) Filed: Jul. 15, 2022

(51) Int. Cl.
  *B23K 20/00* (2006.01)
  *H01L 23/00* (2006.01)

(52) U.S. Cl.
  CPC ........... *H01L 24/78* (2013.01); *B23K 20/004* (2013.01)

(58) Field of Classification Search
  CPC ................. H01L 24/78; B23K 20/004–007
  USPC ....................... 228/180.5, 904, 4.5
  See application file for complete search history.

(56) References Cited

U.S. PATENT DOCUMENTS

| | | | | |
|---|---|---|---|---|
| 4,205,773 A * | 6/1980 | Nicklaus | ................ | H01L 24/85 228/103 |
| 4,653,681 A * | 3/1987 | Dreibelbis | ........... | B23K 20/005 228/103 |
| 5,031,821 A * | 7/1991 | Kaneda | ................... | H01L 24/78 228/180.5 |
| 5,037,023 A * | 8/1991 | Akiyama | ................ | H01L 24/85 228/180.5 |
| 5,277,355 A * | 1/1994 | Weaver | ................ | B23K 20/004 228/4.5 |
| 5,395,038 A * | 3/1995 | Olson | ..................... | H01L 24/78 228/180.5 |
| 5,452,838 A * | 9/1995 | Farassat | ................. | B23K 20/10 228/1.1 |
| 6,082,657 A * | 7/2000 | Chen | ....................... | H01L 24/85 242/412.2 |
| 6,176,414 B1 * | 1/2001 | Sadler | ..................... | H01L 24/85 228/1.1 |
| 6,398,098 B1 * | 6/2002 | Kada | ....................... | H01L 24/78 228/180.5 |
| 6,474,538 B1 * | 11/2002 | Yonezawa | ............... | H01L 24/78 228/180.5 |
| 6,667,625 B1 * | 12/2003 | Miller | ..................... | H01L 24/85 228/104 |
| 7,789,289 B2 * | 9/2010 | Bajahr | .................... | H01F 27/40 29/760 |
| 2001/0002031 A1 * | 5/2001 | Mochida | ............. | B23K 20/004 228/8 |

(Continued)

FOREIGN PATENT DOCUMENTS

| | | | | |
|---|---|---|---|---|
| CN | 101522356 A | * | 9/2009 | ........... B23K 20/004 |
| EP | 447085 A | * | 9/1991 | ........... B23K 20/005 |
| JP | 02192133 A | * | 7/1990 | ............. H01L 24/78 |

*Primary Examiner* — Kiley S Stoner
(74) *Attorney, Agent, or Firm* — OSTROLENK FABER LLP

(57) ABSTRACT

A wire bonding system has a bonding tool and a wire guide for guiding a bonding wire to a tip of the bonding tool for conducting wire bonding operations. A wire biasing tool is located adjacent to the wire guide, and a rotary actuator is operatively connected to the wire biasing tool by a linkage mechanism. The rotary actuator is operable to move the wire biasing tool along a predetermined travel path to apply a biasing force onto a length of bonding wire extending from the tip of the bonding tool.

10 Claims, 3 Drawing Sheets

(56) References Cited

U.S. PATENT DOCUMENTS

| | | | | |
|---|---|---|---|---|
| 2002/0063144 A1* | 5/2002 | Yamaguchi | ............ | H01L 24/85 |
| | | | | 228/180.5 |
| 2004/0245314 A1* | 12/2004 | Vischer | .................. | H01L 24/78 |
| | | | | 228/4.5 |
| 2011/0101073 A1* | 5/2011 | Zhang | ................. | B23K 20/005 |
| | | | | 228/103 |
| 2013/0200134 A1* | 8/2013 | Byars | ............... | H01L 21/67138 |
| | | | | 228/155 |
| 2013/0341377 A1* | 12/2013 | Cheng | .................... | H01L 24/78 |
| | | | | 228/4.5 |

\* cited by examiner

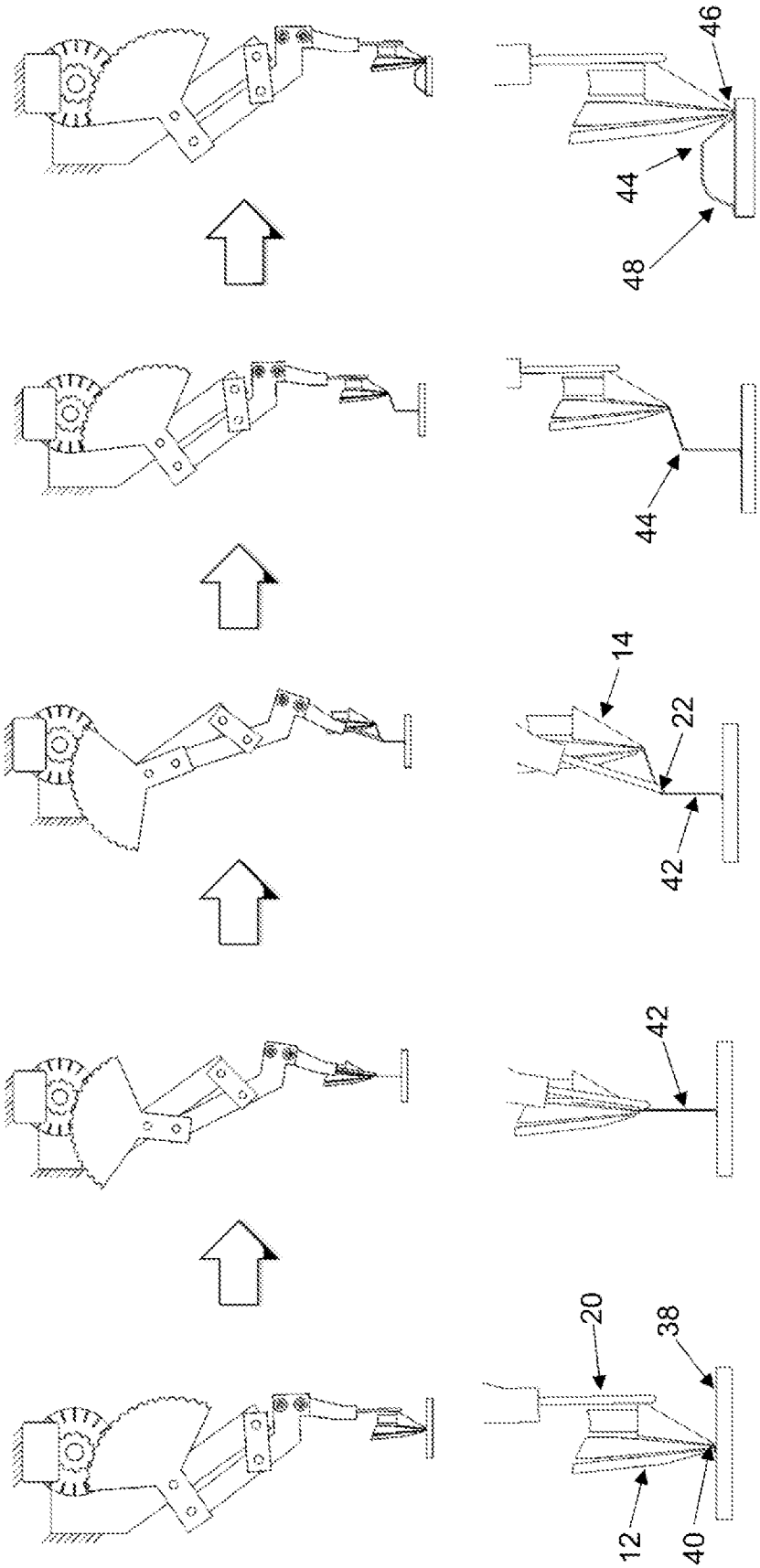

WIRE BONDING SYSTEM INCLUDING A WIRE BIASING TOOL

FIELD OF THE INVENTION

This invention relates to the formation of wire bonds to create electrical interconnections between electronic devices, and in particular but not exclusively the formation of wire bonds using relatively heavy bonding wires, such as aluminum wire.

BACKGROUND

Wire bonding systems are generally used to form wire connections between two separate locations, such as a bond pad on a semiconductor die and a lead of a lead frame. The wire bonding system for heavy bonding wires such as aluminum wire usually includes a bond head having a wedge tool, and a wire feeding mechanism.

Typically, relatively large and heavy wires are used in conjunction with wedge wire bonding for high power electronic packages, which conduct larger currents in operation. A wedge wire bonding machine that is configured to bond such wires generally comprises a bond head that is able to position itself relative to the electronic packages in the X, Y, Z and theta axes for wedge wire bonding. A theta axis is necessary in wedge wire bonding for aligning an orientation of a wire bond with the wire being fed between a first bond and a second bond.

During wire bonding, the bonding process may involve the application of force and ultrasonic energy at a tip of the wedge tool to form an intermetallic connection between the bond pad of a semiconductor die or a lead and the bonding wire. There are four main steps involved in the process. A first bond is made on a target position on a first bond pad. The wire feeding mechanism then feeds bonding wire to the wedge tool as the wedge tool moves away from the first bond. Movement of the wedge tool relative to the first bond is operative to form a loop in the bonding wire.

Next the bonding wire is guided towards another target position by the wedge tool in order to form a second bond at another target position. Ultrasonic energy is again applied to the tip of the wedge tool to form another intermetallic connection between the bonding wire and a second bond pad. Then, the bonding wire is cut from the second bond so as to break the bonding wire from the second bond, and the wedge tool is moved away from the second bond for the formation of the next wire interconnection and wire loop.

It is desirable for a height of the wire loop so created by the wedge tool between the first bond and the second bond to be as low as possible, so as to minimize a height of an assembled electronic package. The formation of wire loops should also be accurate, so as to ensure consistency in the shapes of the wire loops that are formed at different locations.

SUMMARY OF THE INVENTION

It is thus an object of this invention to seek to provide an improved wire bonding system which utilizes a wire biasing tool to more accurately create low wire loops as compared to the prior art.

Accordingly, the invention provides a wire bonding system comprising: a bonding tool and a wire guide for guiding a bonding wire to a tip of the bonding tool for conducting wire bonding operations; a wire biasing tool located adjacent to the wire guide; a rotary actuator operatively connected to the wire biasing tool by a linkage mechanism, the rotary actuator being operable to move the wire biasing tool along a predetermined travel path to apply a biasing force onto a length of bonding wire extending from the tip of the bonding tool.

These and other features, aspects, and advantages will become better understood with regard to the description section, appended claims, and accompanying drawings.

BRIEF DESCRIPTION OF THE DRAWINGS

An embodiment of the present invention will now be described, by way of example only, with reference to the accompanying drawings, in which:

FIGS. 3A to 3E illustrate a motion of the wire biasing tool relative to a bonding tool during bonding of a wire connection between first and second bonding points.

In the drawings, like parts are denoted by like reference numerals.

DETAILED DESCRIPTION OF THE PREFERRED EMBODIMENT OF THE INVENTION

Figure 1:
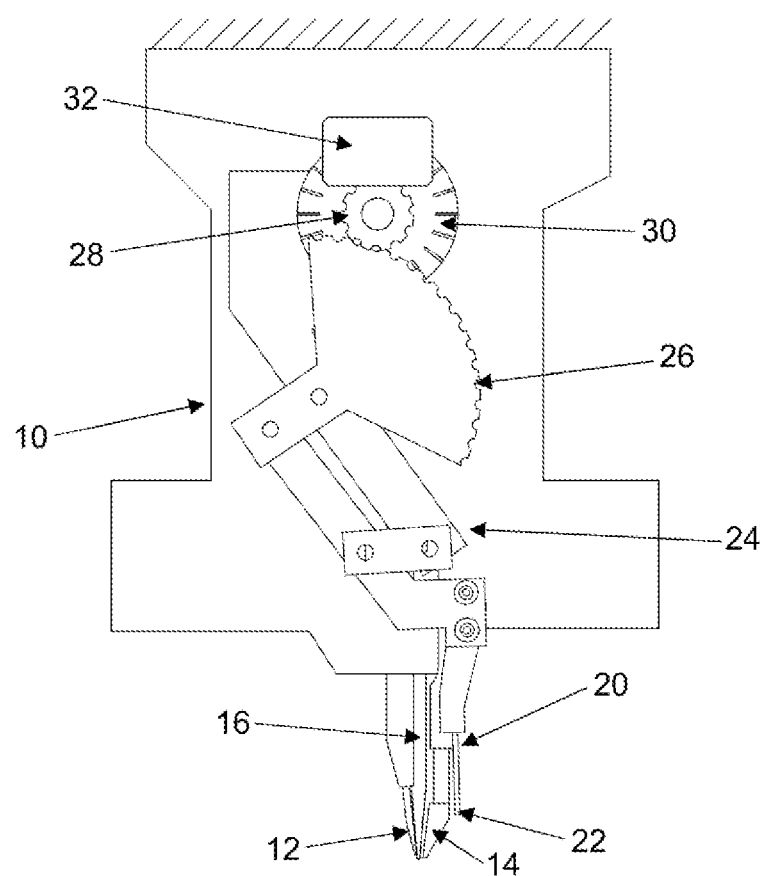
FIG. 1 is a side view of a wire biasing tool according to the preferred embodiment of the present invention.

FIG. 1 is a side view of a wire biasing tool 20 according to the preferred embodiment of the present invention. A wire bonder for forming wire bonds includes a bond head 10, which carries a bonding tool 12, wherein wedge wire bonds are created using force and ultrasonic energy at a tip of the bonding tool 12. A wire guide 14 guides a bonding wire to the tip of the bonding tool 12, and the bonding wire is controllably fed towards the tip of the bonding tool 12 for wire bonding operations. After formation of a wire loop, a cutter 16 is extendable to cut off the bonding wire from the formed wire loop, before the bonding tool 12 creates a next wire bond.

The wire biasing tool 20 is located adjacent to wire guide 14 and the bonding tool 12. The wire biasing tool 20 includes a biasing rod 22, which extends horizontally across a wire feeding path of the bonding wire. The wire biasing tool 20 can be actuated to push against the bonding wire, as will be further elaborated on below. The wire biasing tool 20 is operatively connected to a rotary actuator 30 via a linkage mechanism 24 and gears. Advantageously, the linkage mechanism 24 comprises a four-bar linkage system. Such a four-bar linkage system is a closed-chain movable linkage, which consists of four bars or links, which are connected in a loop by four joints, as shown in FIG. 1. The joints are configured so that the links move in parallel planes, forming a four-bar planar assembly.

The linkage mechanism 24 is further attached to a driven gear 26, which is induced to rotate by a driving gear 28 that is located on the rotary actuator 30, upon rotation of the rotary actuator 30. Rotation of the driven gear 26 further actuates the linkage mechanism 24 to move the wire biasing tool 20 towards the wire guide 14 and the bonding wire. The bonding tool 12, rotary actuator 30, gears 24, 26 and wire biasing tool 20 are all mounted on the bond head 10, such that they are all movable together with the bond head 10.

Further, in order detect a rotary angle of a wheel of the rotary actuator 30, and therefore a rotary angle of the driven gear 26 corresponding to it, an encoder 32 may be installed adjacent to the rotary actuator 30 for detecting and measuring a position of the rotary actuator 30 during the operation of the wire biasing tool 20. The rotary actuator 30 is operable to move the wire biasing tool 20 along a predetermined travel path to apply a biasing force onto a length of the bonding wire extending from the tip of the bonding tool 12.

Figure 2A:
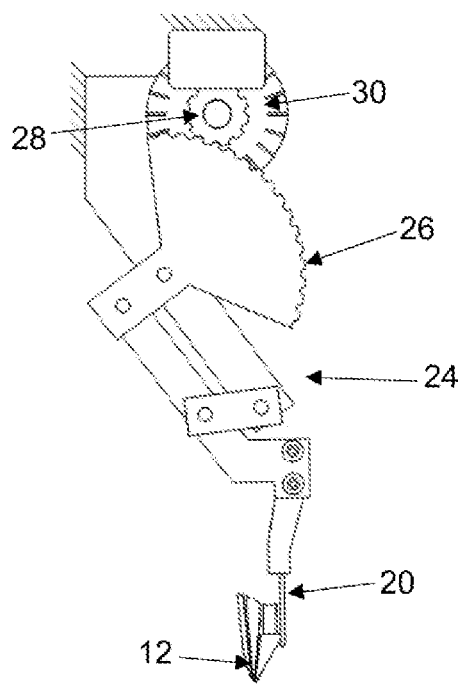
FIGS. 2A to 2C illustrate a typical motion of the wire biasing tool shown in FIG. 1 in use.
Figure 2B:
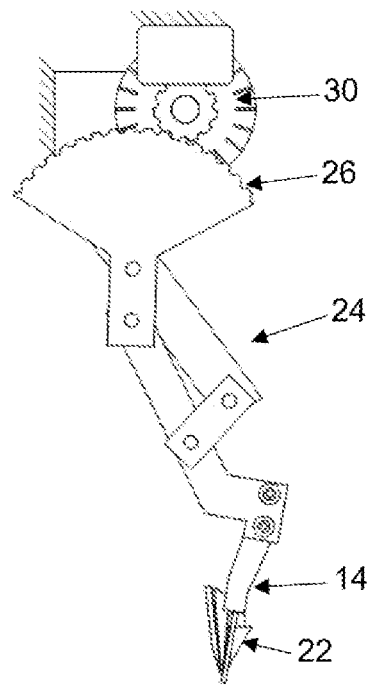
Figure 2C:
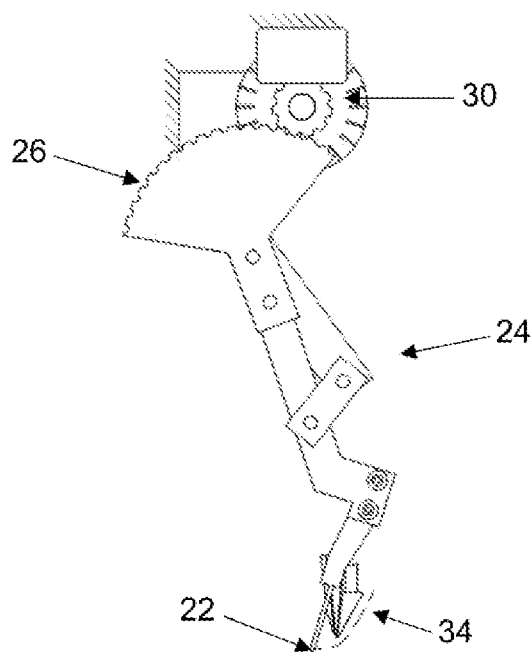

FIGS. 2A to 2C illustrate a typical motion of the wire biasing tool 20 shown in FIG. 1 in use. In FIG. 2A, the wire biasing tool 20 is at its standby position next to the wire guide 14 and is spaced from the bonding wire. In FIG. 2B, the rotary actuator 30 has been rotated clockwise to a predetermined degree, which causes the driving gear 28 to drive the driven gear 26 to rotate anti-clockwise. Rotation of the driven gear 26 actuates the linkage mechanism 24 to move the biasing rod 22 of the wire biasing tool 20 towards the wire guide 14 and bonding wire.

In FIG. 2C, due to further rotation of the rotary actuator 30, the driven gear 26 is further rotated anti-clockwise while the biasing rod 22 of the wire biasing tool 20 moves across the wire guide 14 and bonding tool 12 along a travel path 34 underneath the wire guide 14 and the bonding tool 12 in order to push against and deflect the bonding wire below the bonding tool 12. The travel path 34 therefore spans a locus of the biasing rod's motion. The encoder 32 is able to determine a rotary position of the rotary actuator 30, and thus indirectly detect a position of the biasing rod 22, at each stage of motion along the said locus.

FIGS. 3A to 3E illustrate a motion of the wire biasing tool 20 relative to a bonding tool 12 during bonding of a wire connection between first and second bonding points. In FIG. 3A, the bonding tool 12 has descended on a bonding surface 38 and formed a first wire bond 40 onto the bonding surface 38. At this time, the wire biasing tool 20 is at its standby position next to the wire guide 14.

After forming the first wire bond 40, the bonding tool 12 is raised to a predetermined height while releasing bonding wire 42 which extends from the first wire bond 40, to allow the biasing rod 22 to push against the bonding wire 42 along the travel path 34 of the biasing rod 22, as shown in FIG. 3B. At this time, the wire biasing tool 20 may then be actuated by the rotary actuator 30 to move below the wire guide 14 and the bonding tool 12 with a sufficient clearance over the bonding surface 38 to allow the biasing rod 22 to contact the bonding wire 42.

In FIG. 3C, while the biasing rod 22 abuts against the bonding wire 42, the bonding tool 12 is moved horizontally in a direction away from the biasing rod 22 to bend the bonding wire 42 in cooperation with the biasing rod 22.

In FIG. 3D, the wire biasing tool 20 has been moved back to its standby position, and a kink 44 has been formed in the bonding wire 42. Finally, the bonding tool 12 descends onto another location on the bonding surface 38 in order to form a second wire bond 46, as shown in FIG. 3E. After formation of the second wire bond 46, the cutter 16 may be extended to cut off the bonding wire 42 from the wire loop 48 that has been created between the first wire bond 40 and the second wire bond 46, in order to create a next wire bond.

It should be appreciated that a benefit of utilizing a rotary actuator 30 to drive the wire biasing tool 20 which is attached to a four-bar linkage system is that such rotary actuation is more accurate as compared to many other types of power trains. For instance, a coupling effect that is experienced in linear-to-rotary power trains may risk misalignment and shifting, and may impart stress on the system. Hence, greater consistency in performance is achievable using the approach described in connection with the preferred embodiment of the invention.

Moreover, the use of a four-bar linkage in the linkage mechanism 24 provides a smooth and continuous moving path for the biasing rod 22, which increases the repeatability of the biasing force and travel direction of the biasing rod 22. Utilizing a rotary actuator 30 also enables the integration of an encoder 32 for feedback control, which makes precision position control possible when the biasing rod 22 is pushing against the bonding wire 42.

Of course, other variations of the specific construction and arrangement of the wire biasing tool 20 that is disclosed above can be made by those skilled in the art without departing from the invention as defined in the appended claims.

Although the present invention has been described in considerable detail with reference to certain embodiments, other embodiments are also possible.

Therefore, the spirit and scope of the appended claims should not be limited to the description of the embodiments contained herein.

The invention claimed is:

1. A wire bonding system comprising:
   a bonding tool and a wire guide for guiding a bonding wire to a tip of the bonding tool for conducting wire bonding operations;
   a wire biasing tool located adjacent to the wire guide;
   a rotary actuator including a rotatable wheel which is operatively connected to the wire biasing tool by a linkage mechanism, the rotary actuator being operable to move the wire biasing tool along a predetermined travel path to apply a biasing force onto a length of bonding wire extending from the tip of the bonding tool.

2. The wire bonding system as claimed in claim 1, wherein the linkage mechanism comprises a four-bar linkage system.

3. The wire bonding system as claimed in claim 2, wherein the four-bar linkage system consists of four links which are connected in a loop by four joints that are configured so that the links move in parallel planes.

4. The wire bonding system as claimed in claim 1, wherein the wire biasing tool includes a biasing rod which extends horizontally across a wire feeding path of the bonding wire.

5. The wire bonding system as claimed in claim 4, wherein the biasing rod is operative to move along the travel path underneath the wire guide and bonding tool in order to push against and deflect the length of bonding wire below the bonding tool.

6. The wire bonding system as claimed in claim 5, wherein the travel path is configured to span a locus of the biasing rod's motion.

7. The wire bonding system as claimed in claim 1, wherein the linkage mechanism is further attached to a driven gear, and the rotary actuator further includes a driving gear, and the driven gear is induced to rotate by the driving gear upon rotation of the rotary actuator.

8. The wire bonding system as claimed in claim 7, wherein the bonding tool, the rotary actuator, driving gear, driven gear and wire biasing tool are mounted on the bond head, and they are all movable together with the bond head.

9. The wire bonding system as claimed in claim 7, wherein rotation of the driven gear actuates the linkage mechanism to move the wire biasing tool towards the wire guide and the bonding wire.

10. The wire bonding system as claimed in claim 1, further comprising an encoder installed adjacent to the rotary actuator for detecting a rotary angle of the rotary actuator and thus a position of the wire biasing tool moved by the rotary actuator.

* * * * *